(12) United States Patent
Stasiak et al.

(10) Patent No.: US 7,034,332 B2
(45) Date of Patent: Apr. 25, 2006

(54) NANOMETER-SCALE MEMORY DEVICE UTILIZING SELF-ALIGNED RECTIFYING ELEMENTS AND METHOD OF MAKING

(75) Inventors: James Stasiak, Lebanon, OR (US); Kevin F Peters, Corvallis, OR (US); Jennifer Wu, Corvallis, OR (US); Pavel Kornilovich, Corvallis, OR (US); Yong Chen, Sherman Oaks, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 123 days.

(21) Appl. No.: 10/765,799

(22) Filed: Jan. 27, 2004

(65) Prior Publication Data

US 2005/0162881 A1    Jul. 28, 2005

(51) Int. Cl.
    *H01L 35/24* (2006.01)
(52) U.S. Cl. .......................... 257/40; 257/295
(58) Field of Classification Search .................... None
    See application file for complete search history.

(56) References Cited

U.S. PATENT DOCUMENTS

| | | | |
|---|---|---|---|
| 5,772,905 A | 6/1998 | Chou | |
| 6,055,180 A | 4/2000 | Gudesen et al. | |
| 6,103,540 A | 8/2000 | Russell et al. | |
| 6,165,911 A | 12/2000 | Calveley | |
| 6,190,929 B1 | 2/2001 | Wang et al. | |
| 6,208,553 B1 | 3/2001 | Gryko et al. | |
| 6,248,674 B1 | 6/2001 | Kamins et al. | |
| 6,272,038 B1 | 8/2001 | Clausen et al. | |
| 6,375,870 B1 | 4/2002 | Visovsky et al. | |
| 6,432,740 B1* | 8/2002 | Chen | 438/99 |
| 6,459,095 B1* | 10/2002 | Heath et al. | 257/14 |
| 6,574,130 B1 | 6/2003 | Segal et al. | |
| 6,670,631 B1* | 12/2003 | Kornilovich et al. | 257/40 |
| 2001/0054709 A1 | 12/2001 | Heath et al. | |
| 2002/0130353 A1 | 9/2002 | Lieber et al. | |
| 2003/0021141 A1 | 1/2003 | Segal et al. | |
| 2003/0124325 A1 | 7/2003 | Rueckes et al. | |
| 2003/0124837 A1 | 7/2003 | Rueckes et al. | |

OTHER PUBLICATIONS

"Optical rectenna For Direct Conversion of Sunlight to Electricity", B. Berland, L. Simpson, G. Nuebel, T. Collins, and B. Lanning; ITN Energy Systems, Inc., 8130 Shaffer Parkway Littleton, CO 80127; pp. 323-324.*

* cited by examiner

*Primary Examiner*—Chandra Chaudhari

(57) ABSTRACT

A memory device including a substrate, and multiple self-alignednano-rectifying elements disposed over the substrate. Each nano-rectifying element has multiple first electrode lines, and multiple device structures disposed on the multiple first electrode lines forming the multiple self-aligned nano-rectifying elements. Each device structure has at least one lateral dimension less than about 75 nanometers. The memory device also includes multiple switching elements disposed over the device structures and self-aligned in at least one direction with the device structures. In addition, the memory device includes multiple second electrode lines disposed over, electrically coupled to, and self-aligned to the switching elements, whereby a memory device is formed.

27 Claims, 14 Drawing Sheets

NANOMETER-SCALE MEMORY DEVICE UTILIZING SELF-ALIGNED RECTIFYING ELEMENTS AND METHOD OF MAKING

BACKGROUND

Description of the Art

Over the past few years, the demand for ever cheaper and lighter weight portable electronic devices has led to a growing need to manufacture durable, lightweight, and low cost electronic circuits including high density memory chips. Solid state memory devices, typically, have read write speeds on the order of nanoseconds, however, storage capacities that are approaching a Gigabyte are typically achieved. On the other hand, mass storage devices, which usually have a rotating medium, have the capability of storing tens of Gigabytes of data; however, they have read write speeds of the order of only milliseconds.

The ability to manufacture high capacity storage systems is typically constrained by the need to utilize movable or rotating parts, which is a relatively slow process compared to electronic circuit technology. In addition, reliability is an additional problem, in order to decrease the read write times the movable or rotating parts tend to be utilized at as highest speed as possible. Further, if the electronic device is used in a portable application the shock resistance of the system is typically a limitation. Power consumption, overall weight and size, and cost are also factors that limit storage systems.

Generally, silicon based memory devices involve complex architectures utilizing many layers. Each of these layers must be deposited and defined to produce the desired structure for that layer, thus each layer contributes to a higher cost for the semiconductor device. In addition, such complex architectures, typically, result in a reduction in the number of logic cells per unit area of the semiconductor substrate, leading to a reduction in the data storage density for a given chip size. To a large extent, over the past thirty years, a nearly constant exponential increase in the capabilities of microelectronic devices have resulted in unprecedented advances in computational, telecommunication, and signal processing capabilities. In turn, this increase in complexity has driven a corresponding decrease in the feature size of integrated circuit devices, which has typically followed "Moore's Law." However, the continued decrease in feature size of integrated circuits, into the nanometer regime, has become increasingly more difficult, and may be approaching a limit, because of a combination of physical and economic reasons.

Prior proposed solutions to the problem of constructing nanometer-scale devices have typically fallen into two broad categories, one general area can be described as new patterning techniques, the other general area involves new materials having nanometer-scale dimensions. New patterning techniques include both projection systems utilizing radiation, and direct write systems utilizing particle beams, or scanning probes. Some of the newer higher resolution projection systems require expensive radiation sources such as synchrotrons. On the other hand direct write systems, typically, require a serial process of individually writing each structure in contrast to exposing many structures at one time utilizing projection systems. Thus, direct write systems, typically, have a much lower throughput when compared to projection systems again leading to either increased complexity in manufacturing or increased cost or both.

Recently new materials having semiconducting properties and nanometer-scale dimensions have been synthesized and fabricated into nanometer-scale devices. However, after these nanometer-scale materials are formed, they are often randomly arranged, either one end randomly attached to a substrate or both ends free. This randomness along with the difficulty of physically manipulating nanometer-sized components presents a significant challenge to the fabrication of reproducible and practical nanometer-scale devices.

If these problems persist, the continued growth, seen over the past several decades, in cheaper, higher speed, higher density, and lower power integrated circuits used in electronic devices will be impractical.

BRIEF DESCRIPTION OF THE DRAWINGS

FIG. 1b is a cross-sectional view of an element of the memory device shown in FIG. 1a.

DESCRIPTION OF THE PREFERRED EMBODIMENTS

This invention provides for the design and fabrication of self-aligned crossed-wire devices having nanometer scale junction dimensions. The present invention provides a method of fabricating a wide variety of memory devices that include a self-aligned rectifying junction incorporated into the device, in series with the storage media elements or switching elements, to substantially reduce cross-talk or sneak path issues commonly found in most cross-bar type memory devices. In addition, the storage media elements are self-aligned to the rectifying junction. The present invention allows both the material and dopant levels to be optimized for each layer providing a process for optimizing the performance of each layer or structure in the device. A wide variety of rectifying junctions, such as pn diodes, p-i-n diodes, Schottky diodes, metal-insulator-metal rectifying structures may be formed by utilizing the process of the present invention. In addition, a wide variety of storage or switching layers, such as organic or polymeric charge trapping layers, phase change layers, ferroelectric layers, reversible metal filament layers, and molecular monolayers are just a few examples memory or switching layers that may be utilized using the present invention.

It should be noted that the drawings are not true to scale. Further, various parts of the active elements have not been drawn to scale. Certain dimensions have been exaggerated in relation to other dimensions in order to provide a clearer illustration and understanding of the present invention. In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device.

Figure 1A:
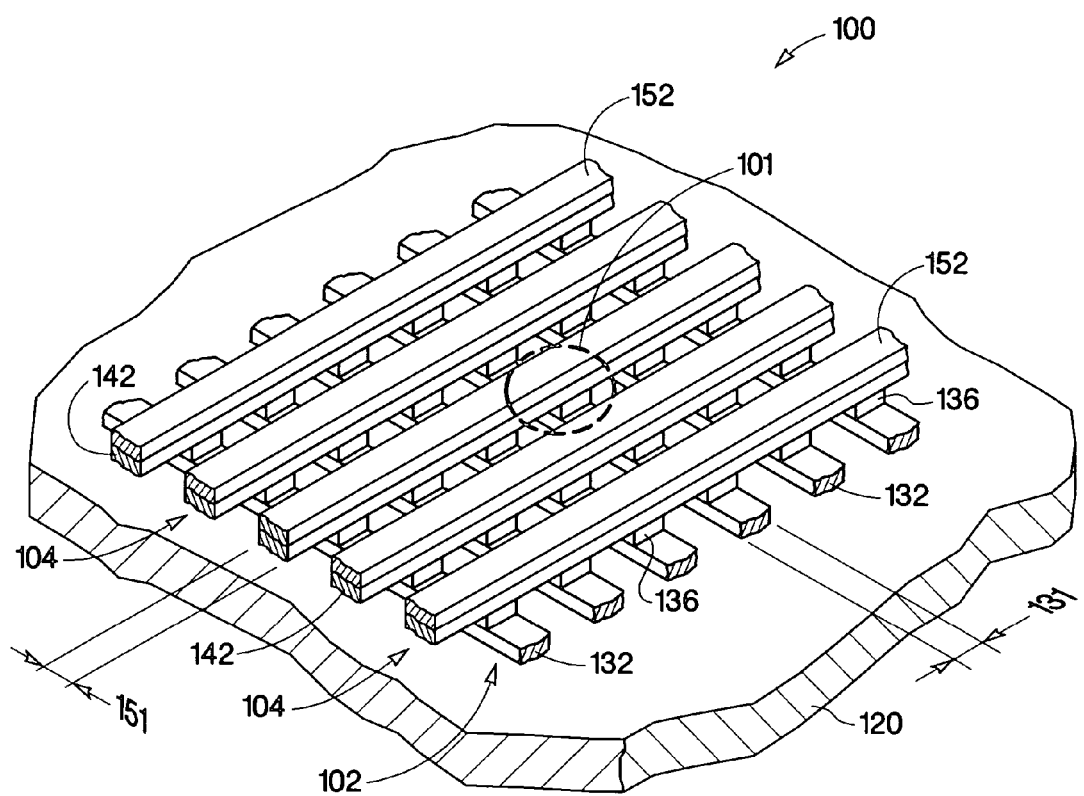
FIG. 1a is a perspective view of a memory device according to an embodiment of the present invention.

An embodiment of the present invention, crossbar memory architecture 100, is illustrated, in a perspective view, in FIG. 1a. First electrode or addressable lines 132 are formed over substrate 120 and are substantially parallel to each other. Device structures 136 are formed over first addressable lines 132. Device structures 136 and first electrode lines 132 form self-aligned nanoscale-rectifying elements 102. First electrode lines 132 and device structures 136 have line width 131 less than about 75 nanometers. In addition, switching lines 142 are formed over device structures 136, and are substantially parallel to each other and substantially mutually orthogonal to first electrode lines 132. Finally, second electrode lines 152 are disposed over and electrically coupled to switching lines 142. Second electrode lines 152 and switching lines 142 have line width 151 less than about 75 nanometers and form self aligned nano-storage structures 104. Although first addressable lines 132, switching lines 142, and second electrode lines 152 are illustrated in FIG. 1a as straight lines each having a constant width it should be appreciated that these lines, in alternate embodiments, may have various curvilinear shapes as well as variable widths. In addition, in alternate embodiments, these lines may also intersect at various angles other than ninety degrees as illustrated.

Figure 1B:
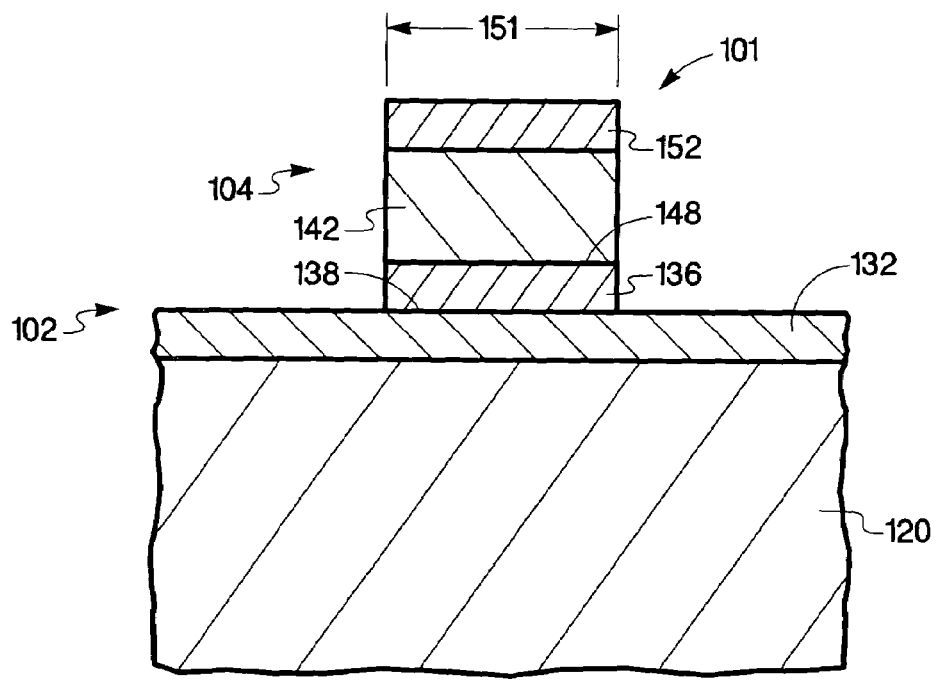

At each intersection of a first electrode line and a second electrode line logic cells 101 are formed. In each logic cell, device structure 136 is substantially facially coextensive, coincident, and coplanar with the first electrode or addressable line and the second electrode or addressable line at the point of intersection for that logic cell. In an alternate embodiment, second electrode lines 152 are disposed over and electrically coupled to switching elements (not shown) having a line width substantially the same as second electrode lines 152 and an element length substantially the same as the line width of first electrode lines 132. The crossbar memory structure shown in FIGS. 1a and 1b provides for self-aligned fabrication of diodes in series with switching elements incorporated directly at the cross-points of the electrode wires. The self-aligned diodes substantially reduce or eliminate the problem of sneak path mitigation or crosstalk that is generally found in all macroscopic field programmable gate array or programmable logic arrays.

As shown, in a cross-sectional view, in FIG. 1b each logic cell includes a device structure electrically coupled to a first electrode line. Interface 138 formed between first electrode line 132 and device structure 136, of logic cell 101, has an area less than about 5,625 square nanometers. Nano-rectifying elements 102, of logic cell 101, may be formed from a wide variety of rectifying materials such as semiconductor junctions (e.g. pn, p-i-n, or npnp junctions), metal-semiconductor junction (e.g. Schottky diodes), metal-insulator-semiconductor structures, metal-insulator-metal structures, as well as organic or polymeric rectifying structures. In addition, each logic cell also includes a switching line electrically coupled to a second electrode line. Switching interface 148 formed between switching line 142 and device structure 136 has an area less than about 5,625 square nanometers. Nano-storage structures 104 may be formed from a wide variety of storage materials such as organic or polymeric charge trapping layers, phase change layers, ferroelectric layers, tunneling layers, piezoelectric layers, fuse layers, filament forming (antifuse) layers, magnetic layers (MRAM), and molecular monolayers.

Substrate 120 may be any substrate material on which the rectifying and switching structures may be formed. Examples of materials include various glasses; ceramics such as aluminum oxide, boron nitride, silicon carbide, and sapphire; semiconductors such as silicon, gallium arsenide, indium phosphide, and germanium; and various polymers such as polyimides, polyethersulphone, polyetherimide, polyethylene naphthalate, polyethylene terephthalate, and polycarbonates are just a few examples of the many materials that may be utilized. Accordingly, the present invention is not intended to be limited to those devices fabricated in silicon semiconductor materials, but will include those devices fabricated utilizing one or more of the available semiconductor materials and technologies known in the art, such as thin-film-transistor (TFT) technology using polysilicon on glass substrates. Further, substrate 120 is not restricted to typical wafer sizes, and may include processing a polymer sheet or film or glass sheet or for example a single crystal sheet or a substrate handled in a different form and size than that of conventional wafers or substrates. The actual substrate material utilized will depend on various parameters such as the maximum processing temperature utilized, the environment to which the memory device will be subjected as well as various components such as particular rectifying structure, switching line and electrodes utilized.

Figure 2:
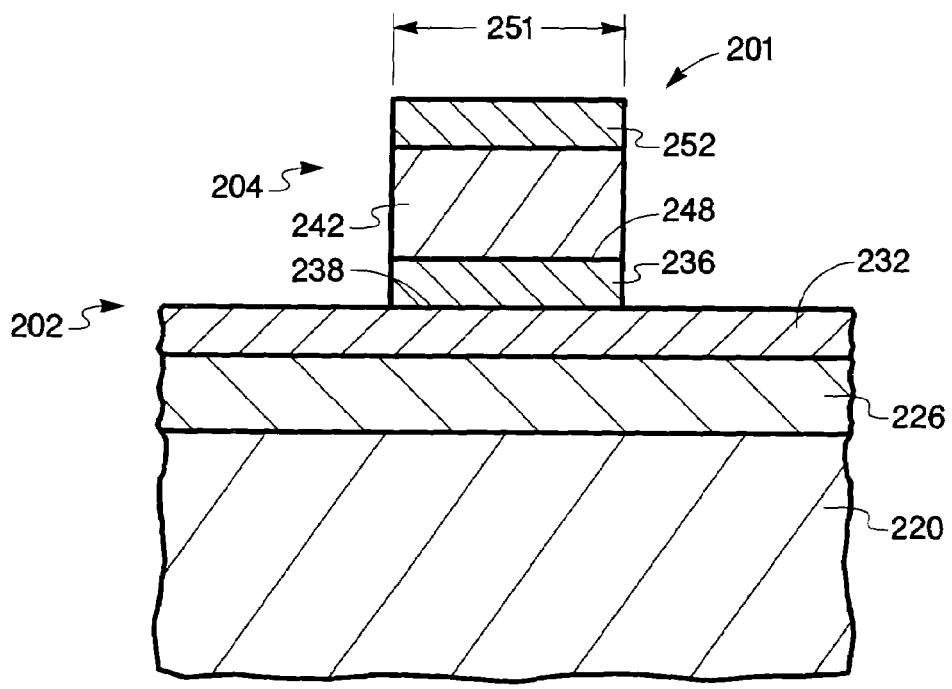
FIG. 2 is cross-sectional view of an element of a memory device according to an alternate embodiment of the present invention.

An alternate embodiment of the present invention utilizing a Schottky barrier diode structure is shown in a cross-sectional view in FIG. 2. In this embodiment, first addressable line 232 and device structure 236 form a Schottky barrier rectifying contact at rectifying interface 238 of logic cell 201. First addressable line 232 and device structure 236 form self-aligned rectifying element 202 having a line width (similar to line width 131 shown in FIG. 1a) in the direction of first addressable line 232 of less than about 75 nanometers. In addition, logic cell 201 includes switching line 242 and second electrode line 252 disposed over switching line 242. Switching line 242 and second electrode line 252 are each substantially parallel to each other and substantially mutually orthogonal to first addressable line 232 similar to that shown in FIG. 1a. Second electrode line 252 and switching line 242 have line width 251 less than about 75 nanometers and form self-aligned nano-storage structures 204. Further, switching line 242 and device structure 236 form switching interface 248 that self-aligns device structure 236 to switching line 242 in the first electrode line direction and self-aligns device structure 236 to second electrode line 252 in the second electrode line direction. Switching interface 248 has an area less than about 5,625 square nanometers. The combination of self-aligned nano-storage structure 204 and self-aligned rectifying element 202 of logic cell 201 provides for device structure 236 to be self-aligned in two mutually orthogonal directions.

Substrate 220, in this embodiment, is a semiconductor substrate such as a silicon, germanium or gallium arsenide wafer. To provide electrical isolation of first addressable line 232 from a doped substrate 220 optional dielectric layer 226 is shown in FIG. 2. For example, substrate 220 may be a lightly doped silicon wafer with dielectric layer 226 being a silicon dioxide layer. First addressable line 232 may be a metal such as magnesium, antimony, aluminum, silver, copper, nickel, gold, platinum, or palladium and form reasonable barrier heights disposed on the silicon dioxide surface, and device structure 236 may then be a lightly doped n-type polysilicon or amorphous silicon layer to complete the formation of the Schottky barrier diode at rectifying interface 238. In alternate embodiments, a lightly doped p-type layer may be formed on a metal such as gold or platinum silicide to also form a Schottky barrier. In still other embodiments, self-aligned rectifying element 202 may include a p+ or n+ type epitaxial layer disposed on an intrinsic single crystalline silicon layer (not shown) to form addressable line 232. An additional lightly doped epitaxial layer or a layer with a graded doping profile ending in a lightly doped surface may be formed on the heavily doped layer (not shown). Device structure 236, in such an embodiment, may then include a thin layer of the appropriate metal or metal silicide to complete the formation of the Schottky barrier contact. For those embodiments utilizing a non-conductive substrate such as glass, ceramic or polymer substrates optional dielectric layer 226 may be omitted if desired. For example, utilizing either a glass or polyimide substrate addressable line 232 may be formed utilizing a metal such as platinum deposited or formed directly on substrate 220 with device structure 236, utilizing the appropriate type dopant such a an n-type dopant, formed directly on addressable line 232.

Figure 3:
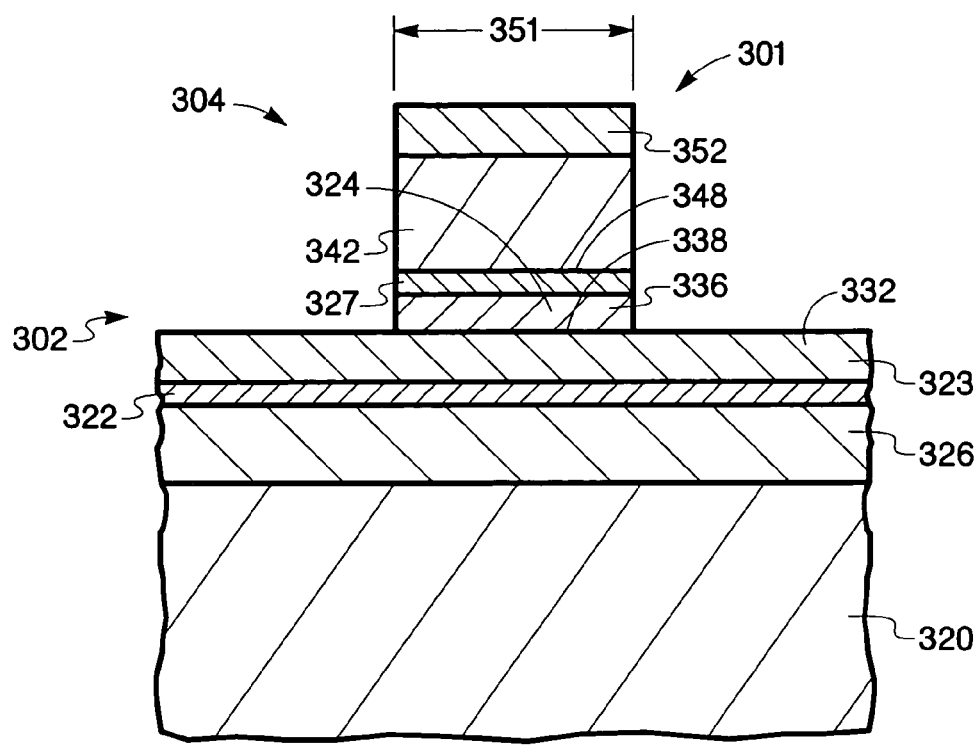
FIG. 3 is cross-sectional view of an element of a memory device according to an alternate embodiment of the present invention.

An alternate embodiment of the present invention utilizing an epitaxial semiconductor diode junction is illustrated, in a cross-sectional view, in FIG. 3. Epitaxial thin films are utilized to create semiconducting layers 322, 323, and 324, and are formed using conventional semiconductor processing equipment. First addressable layer 332 includes a specified dopant of a first polarity and a specified dopant concentration, and is formed between substrate 320 and device structure 336. The particular dopant material and the dopant concentration will depend on various factors, such as the junction dimensions as well as the particular application the device will be used in. Device structure 336 includes a dopant of a second polarity, that is of opposite polarity as that used first addressable layer 332. In this embodiment, rectifying junction interface 338 is formed between p-type epitaxial layer 323 and n-type epitaxial layer 324 of logic cell 301. Nano-rectifying element 302, in this embodiment, also includes optional n+ type epitaxial layer 327 that may be utilized to provide for better electrical coupling to storage media line 342 depending on the particular material or materials utilized to form storage line 342. In this embodiment, substrate 320 is a conventional silicon semiconductor wafer with dielectric layer 326, a silicon dioxide layer, formed between silicon substrate 320 and intrinsic single crystalline silicon layer 322. In logic cell 301 first addressable line 332 is formed from p-type epitaxial layer 323 and device structure 336 is formed from both n-type epitaxial layer 324 and optional n+ type epitaxial layer 327. In alternate embodiments, first addressable line 332 may be formed from an n-type material and device structure 336 may be formed from a p-type material. For example, doped polycrystalline or amorphous silicon may be formed over dielectric layer 326 to form both layers. Another example includes a doped germanium or silicon germanium alloy layer formed over dielectric layer 336 as one of the semiconductor layers utilized to form rectifying junction interface 328. In still other embodiments, various other substrate materials as described above for the embodiment shown in FIG. 1 may also be utilized.

In this embodiment, switching line 342 and device structure 336 forms switching interface 348 that self-aligns device structure 336 to both switching line 342 and second electrode line 352 in the second electrode line direction. Switching line 342 is substantially parallel to each other and is substantially mutually orthogonal to first addressable line 332 similar to that shown in FIG. 1*a*. In logic cell 301, second addressable line 352 is disposed over switching line 342 and is also substantially parallel to other addressable lines (not shown), and is substantially mutually orthogonal to first addressable line 332 similar to that shown in FIG. 1*a*. In this embodiment, second electrode line 352 and switching line 342 each have line width 351 less than about 75 nanometers and they form self-aligned nano-storage structure 304. The combination of self-aligned nano-storage structure 304 and self-aligned rectifying element 302 provides for device structure 336 to be self-aligned in two mutually orthogonal directions.

Figure 4:
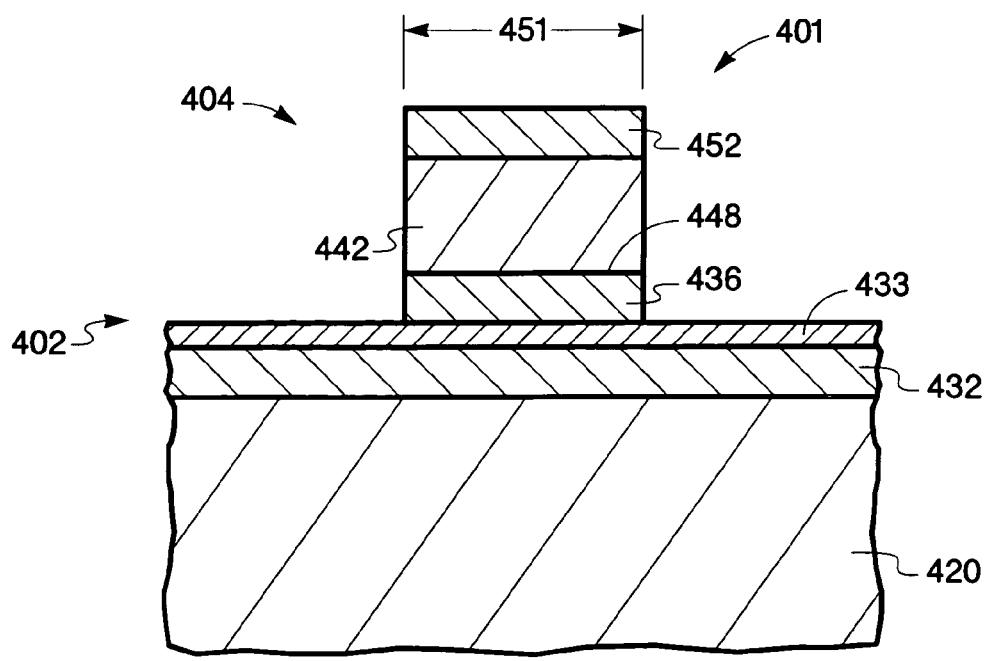
FIG. 4 is cross-sectional view of an element of a memory device according to an alternate embodiment of the present invention.

An alternate embodiment of the present invention utilizing a metal-insulator-metal rectifying structure is shown in a cross-sectional view in FIG. 4. In this embodiment, logic cell 401 includes first addressable metal line 432 disposed on substrate 420, with insulating layer 433 disposed on first addressable metal line 432. Device structure 436, in this embodiment, is also a metal layer. In logic cell 401 the combination of first addressable metal line 432, insulating layer 433 and device structure 436 form self-aligned nano-rectifying element 402 having a line width (similar to line width 131 shown in FIG. 1*a*) in the direction of first addressable line 432 of less than about 75 nanometers. In addition, in logic cell 401 switching line 442 and device structure 436 form switching interface 448 where the physical embodiment of the projection (i.e. switching line 442 and device structure 436) of second addressable line 452 onto first addressable line 432 is aligned where second addressable line 452 intersects first addressable line 432. In this embodiment, the switching lines are substantially parallel to each other and are substantially mutually orthogonal to the first addressable lines similar to that illustrated in FIG. 1*a*. Second addressable line 452 is disposed over switching line 442. In this embodiment, the second addressable lines are also substantially parallel to each other and are substantially mutually orthogonal to the first addressable lines similar to that illustrated in FIG. 1*a*. However, in alternate embodiments the lines may have various curvilinear shapes as well as variable widths. In addition, in alternate embodiments, these lines may also intersect at various angles other than ninety degrees. In this embodiment, second electrode lines 452 and switching lines 442 have line widths 451 less than about 75 nanometers and form self-aligned nano-storage structures 404. The combination of self-aligned nano-storage structures 404 and self-aligned rectifying elements 402 provides for device structures 436 to be self-aligned in two mutually orthogonal directions.

Figure 5:
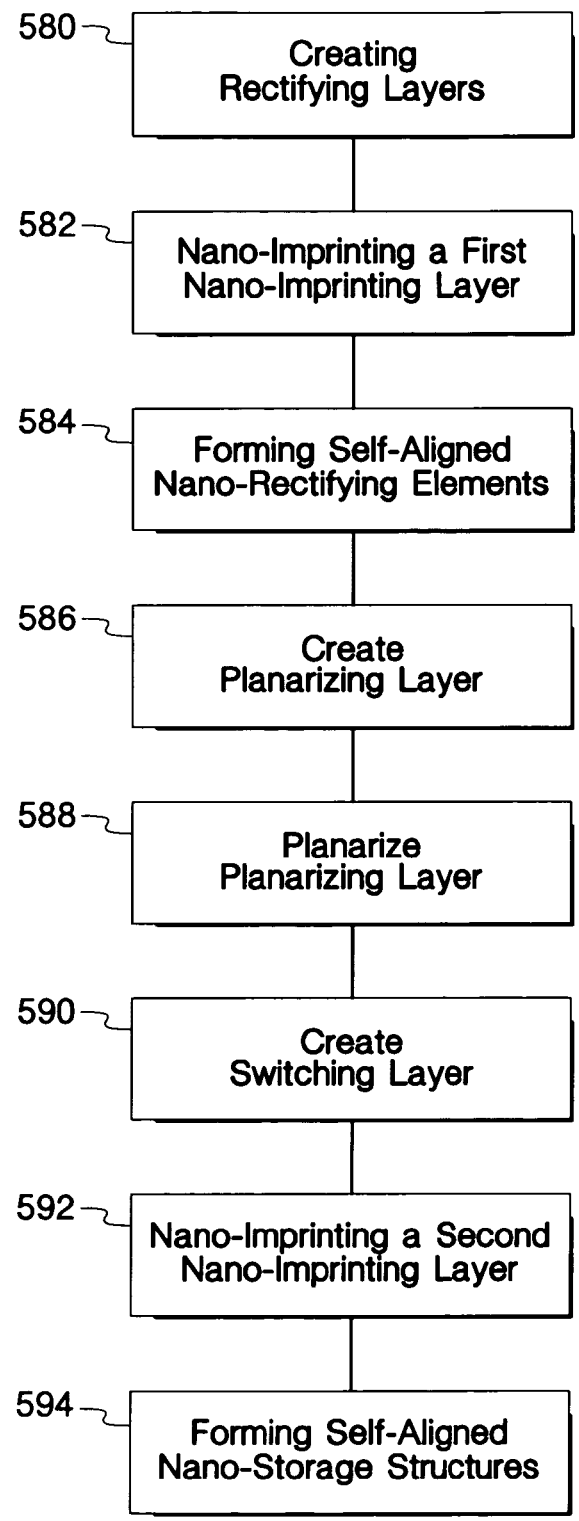
FIG. 5 is a flow chart of a process used to create a memory device according to an embodiment of the present invention.
Figure 6A:
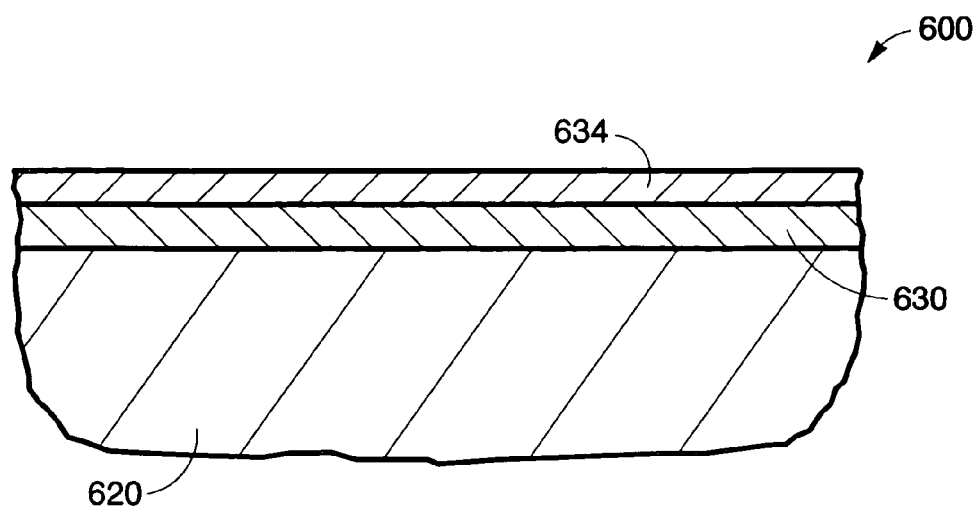
FIGS. 6a–6n are cross-sectional views of various processes used to create embodiments of the present invention.

FIG. 5 is a process flow chart illustrating a process used to create embodiments of the present invention. FIGS. 6*a*–6*n* are illustrations of the processes utilized to create a self-aligned nano-rectifying elements and self-aligned nano-storage structures to create a memory device, and are shown only to better clarify and understand the present invention. Actual dimensions are not to scale and some features are exaggerated to more clearly point out the process.

Rectifying layer creation process 580 is an optional process utilized to create first addressable layer 630 and device structure layer 634 as illustrated in a cross-sectional view in FIG. 6*a*. The particular process utilized will depend on the particular type of rectifying elements utilized in memory device 600 as well as the particular type of substrate utilized. For example, if the rectifying elements are semiconductor junction diodes formed on a semiconductor wafer then addressable layer 630 and device structure layer 634 may be formed using conventional semiconductor processing equipment utilizing any of the wide variety of epitaxial techniques such as chemical vapor deposition (CVD) including atmospheric (APCVD), low pressure (LPCVD), or plasma enhanced (PECVD) variants, Atomic Layer Deposition (ALD), or molecular beam epitaxy (MBE) to name just a few. In addition, amorphous or polycrystalline semiconductor films may be formed on substrate 620 followed by a subsequent recrystallization step to form a single crystal or substantially single crystalline layer. The recrystallization step generally utilizes thermal, laser, or electron beam heating of the substrate and the deposited layer to supply the energy utilized to recrystallize the deposited film. In alternate embodiments, a buried insulator layer also may be utilized. Doped polycrystalline or amorphous layers also may be utilized to form first addressable layer 630 and device structure layer 634 without forming an epitaxial layer depending on the particular storage material used as well as the particular application in which the cross-bar device is utilized.

For those embodiments utilizing a metal layer such as to form a Schottky barrier contact or a metal-insulator-metal rectifying structure various types of metal deposition equipment and techniques such as PECVD, CVD, metalorganic CVD (MOCVD), sputter deposition, evaporation, and electro-deposition also may be utilized. For example, gold, platinum, or palladium may be sputter deposited onto substrate 620 to form first addressable layer 630. In another example tantalum may be electron beam evaporated to form a portion of a metal-insulator-metal rectifying structure.

Figure 6B:
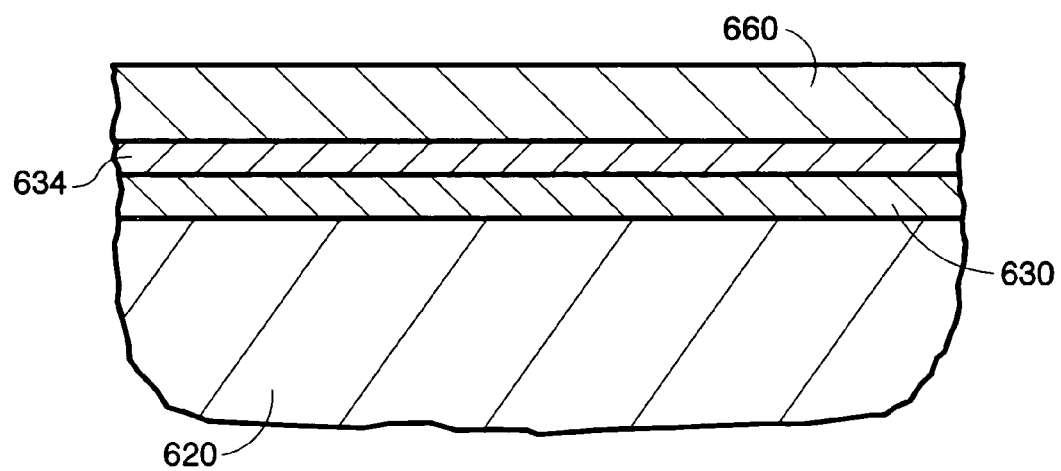
Figure 6C:
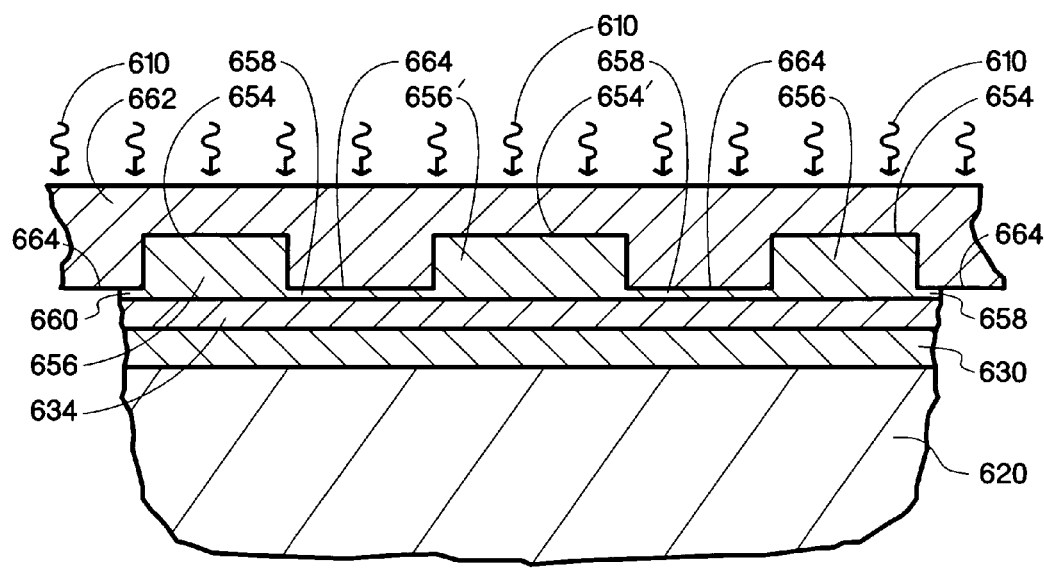
Figure 6D:
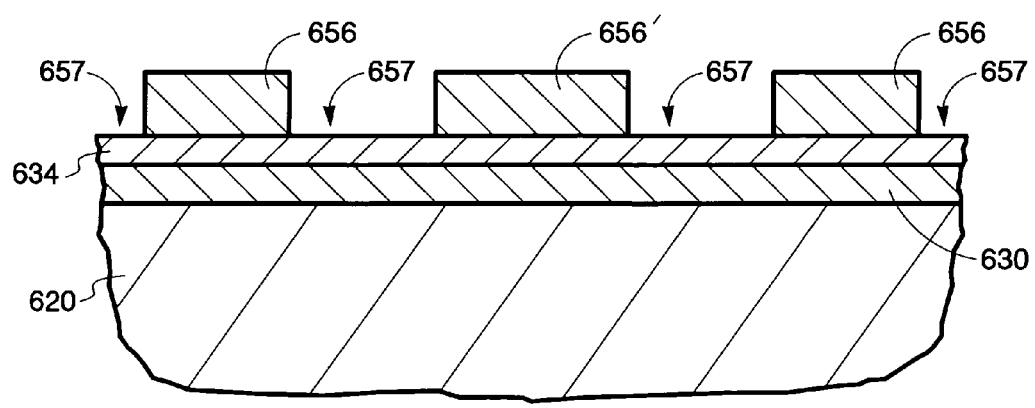

Nano-imprinting process 582 is utilized both to form or create imprint layer 660 and to imprint the desired structures or features into imprint layer 660 (see FIGS. 6b–6d). The imprint layer may be applied utilizing any of the appropriate techniques such as spin coating, vapor deposition, spray coating or ink jet deposition to name just a few examples. In one embodiment, imprint layer 660 is a polymethyl methacrylate (PMMA) spin coated onto device structure layer 634. Imprint layer 660 may be any moldable material. That is any material that either flows or is pliable under a first condition and relatively solid and less pliable under a second condition may be utilized. Typically, for polymeric imprint layers utilized in a thermal imprinting process a low temperature bake process is utilized to drive off any excess solvent that may remain after the imprint layer is applied to or coated on device structure layer 634. Generally, in those embodiments utilizing a "step and flash" process a transfer layer is first applied or coated onto device structure layer 634 followed by creating or forming a photo-curable layer disposed on the transfer layer. For example, imprint layer 660 may include an organic transfer layer such as HR 100 sold by OLIN and a photo-curable layer that includes ethylene glycol diacrylate (3-acryloxypropyl)tris(trimethylsiloxy)silane, t-butyl acrylate, and 2-hydroxy-2-methyl-1-phenyl-propan-1-one. Low viscosity, high cure speed, controlled shrinkage during cure, low evaporation rate, high modulus, good adhesion to the layer it is deposited on, and good release from the nano-imprinter are desirable properties for the photo-curable layer. In still another embodiment, the photo-curable layer may be created utilizing a material sold by Molecular Imprints Inc. under the name S-FIL Monomat Ac01. In addition, various other photopolymerizable low viscosity acrylate-based solutions that include an organosilicon compound also may be utilized to create imprint layer 660. Imprint layer 660 is imprinted utilizing nano-imprinter 662 (see FIG. 6c). Nano-imprinter 662 is pressed or urged toward imprint layer 660 under a condition in which the imprint layer is pliable. Nano-imprinter 662 includes features or structures having a substantially complementary shape to that desired to be formed in imprint layer 660. Protrusions 664 and indentations 654 and 654', as illustrated in FIG. 6c, represent the desired structures of nano-imprinter 662. By complementary, it is meant that the pattern formed in imprint layer 660 (see FIG. 6c) has a shape corresponding to the complement of the pattern formed in nano-imprinter 662 (see FIG. 6c). That is protrusion 664 on the nano-imprinter forms recessed feature 658 (see FIG. 6c) and indentation 654 and 654' forms raised feature 656 and 656' respectively (see FIG. 6c) where 654' represents a change in the structure or feature imprinted in that particular location (i.e. as drawn it represents a change in line width). For example, an imprint layer formed utilizing a photo-curable material such as S-FIL Monomat Ac01 may be imprinted with a two-newton force utilizing an imprinter backpressure of 0.25 bar. A photo-curable material such as S-FIL Monomat Ac01 may be cured by an exposure with I-line radiation (i.e. 365 nanometers) utilizing a photo source such as a 1000 Watt Hg-Xe ultraviolet arc lamp. For purposes of illustration only, FIG. 6c illustrates the use of a nano-imprinter having a transmittance in the wavelength range from about 250 nanometers to about 500 nanometers with ultraviolet photons 610 transmitted through the nano-imprinter impinging upon and photo-curing nano-imprint layer 660. In alternate embodiments, nano-imprinter 662 may be removed before nano-imprint layer is photo cured.

Another example includes heating a PMMA layer above its softening or glass transition temperature. The particular temperature and pressure utilized in the thermal nano-imprinting process will depend on various parameters such as the size and shape of the features being molded and the specific materials used for the imprint layer.

Self-aligned nano-rectifying element forming process 584 is utilized to form the first addressable lines and device structure from their corresponding layer. Nano-rectifying forming process includes removing recessed features 658 (see FIG. 6c) formed during nano-imprinting. Removing the recessed features may be accomplished by any wet or dry etch process appropriate for the particular material utilized for the imprint layer. For example, to remove residual PMMA, in a thermal imprint process, that forms recessed feature 658 (see FIG. 6c) an oxygen reactive ion etch may be utilized. In alternate embodiments, utilizing a "step and flash process, such as one utilizing S-FIL Monomat, a fluorine rich reactive ion etch followed by a oxygen rich plasma or reactive ion etch to remove the transfer layer may be utilized. Removal of recessed feature 658 exposes device structure layer 634 (see FIG. 6d) in exposed regions 657 while raised features 656 and 656' remain over portions of device structure layer 634 in other areas. For those processes utilizing other polymeric or inorganic imprint layers various wet etches or other reactive ion etches may be utilized.

An optional hard etch mask creating process also may be utilized as part of self-aligned nano-rectifying element forming process 584 to deposit an optional etch mask. The optional hard etch mask (not shown) is formed by depositing a thin metal or dielectric layer over the nano-imprinted surface after the recessed features have been removed. For example, a thin aluminum, chromium, platinum, titanium or tantalum layer may deposited over the nano-imprinted surface. In an alternate embodiment, the hard etch mask may be formed or created separate and then materially transferred onto the nano-imprinted surface. A subsequent lift-off process or a selective chemical etch may be utilized to remove raised portions 656 and 656' (see FIG. 6d) of the imprint layer, causing the hard etch mask material deposited on top of raised portions 656 and 656' to be removed with the metal deposited in exposed regions 657 remaining forming a mask that provides for etching of the regions formerly covered by the raised features. The particular selective chemical etch used will depend on the particular imprint material and hard etch mask material used. Tetrahydrofuran (THF) may be utilized as a selective etch for PMMA. Other examples of selective chemical etches for PMMA are ethanol water mixtures, and a 1:1 ratio of isopropanol and methyl ethyl ketone used above 25° C. Preferably, acetone at room temperature in an ultrasonic bath is utilized as a selective etch for PMMA followed by an isopropanol rinse. Another example for PMMA, utilizes a methylene chloride soak for about 10 minutes followed by agitating in methylene chloride in an ultrasonic cleaner for about 1 minute. A plasma clean process may also be utilized, in addition to the selective chemical etch, to further clean the exposed surface regions of device structure layer 634 and the surface of the hard etch mask. This optional hard etch mask may be formed from any metal, or dielectric material that provides the appropriate selectivity in etching device structure layer 634 and first addressable layer 630. Generally this optional hard etch mask is utilized, in embodiments, where the imprint layer would be damaged or degraded in the etching process used in etching either device structure layer 634 or first addressable layer 630.

Figure 6E:
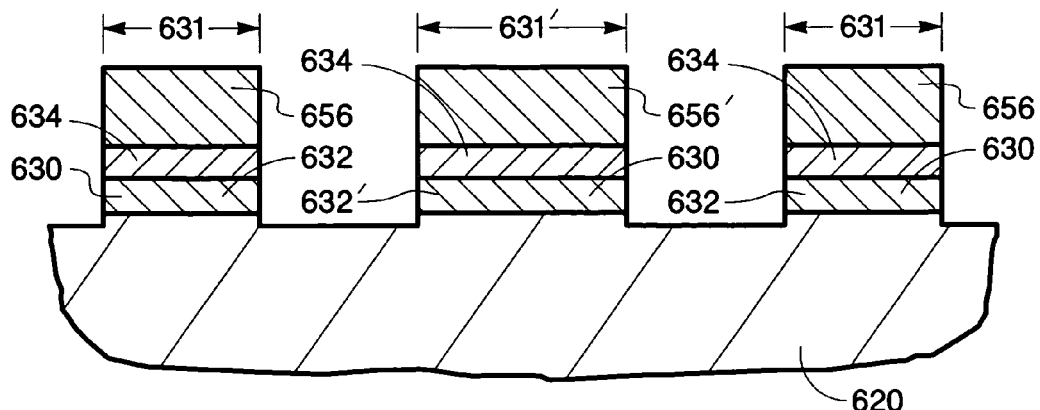

Self-aligned nano-rectifying element forming process 584 also includes an etching process to etch device structure layer 634 and first addressable layer 630 in those areas either not protected by raised features 656 and 656' as shown in FIG. 6d and 6e or those areas not protected by the optional etch mask as described above. The etching of device structure layer 634 and first addressable layer 630 may utilize any wet or dry etch process or any combination of processes appropriate for the particular material or materials utilized as well as the dopant material used in those embodiments utilizing a doped semiconductor layer. Depending on the particular material being etched, as well as the particular application in which the device will be used, the etch profile also may extend into the substrate 620 as shown in FIG. 6e. For example, CMOS compatible wet etches include tetramethyl ammonium hydroxide (TMAH), potassium or sodium hydroxide (KOH and NaOH), and ethylene diamine pyrochatechol (EDP). Examples of dry etches that can be utilized are fluorinated hydrocarbon gases ($CF_4$), xenon difluoride ($XeF_2$), and sulfur hexafluoride ($SF_6$). The etching process forms first addressable lines 632 and 632' having line widths 631 and 631' respectively. Line widths 631 and 631' typically have widths less than about 75 nanometers. The actual line width will depend on various parameters and components utilized in the memory device, such as the particular materials used to form first addressable layer 630 and device structure layer 634 as well as the particular application in which the memory device will be used. In addition, the etching process also self-aligns device structure layer 634 to first addressable lines 632 and 632' along the direction of the lines as shown in FIGS. 6e and 6f, forming device structure lines 635 and 635'.

Figure 6F:
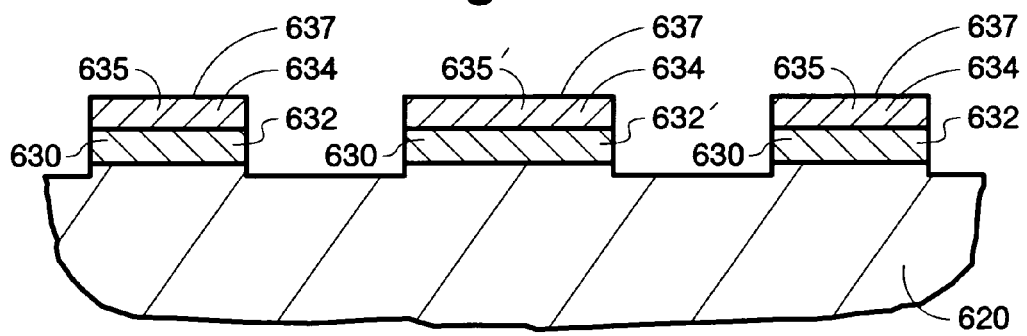

Self-aligned nano-rectifying element forming process 584 may also include a mask removal process utilized to remove either imprint mask raised features 656, and 656' as shown in FIGS. 6e and 6f or the optional hard etch mask (not shown) described above. In general the mask removal process may utilize any wet or dry etch process appropriate for the particular material utilized for the mask. For those embodiments utilizing imprint layer 660 (see FIG. 6c) as an etch mask any of the processes described above for removing raised features 656 and 656' in creating the optional hard etch mask such as THF, methylene choride or oxygen plasma etching also may be used in this process. For those embodiments utilizing the optional hard etch mask (not shown), the particular etch process will depend on the particular material utilized to form the mask. For example, a sulfuric peroxide or sodium hydroxide wet etch may be utilized to etch an aluminum hard etch mask. In addition, the mask removal process exposes device structure surface 637 as shown in FIG. 6f.

Figure 6G:
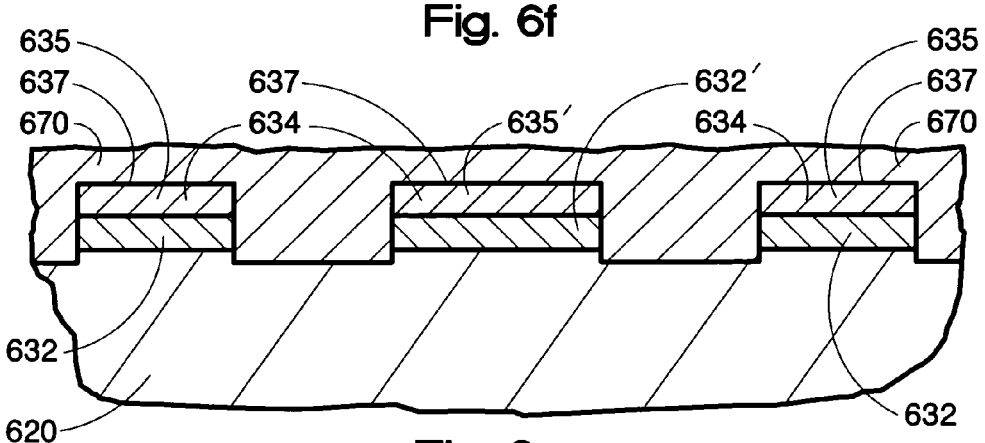
Figure 6H:
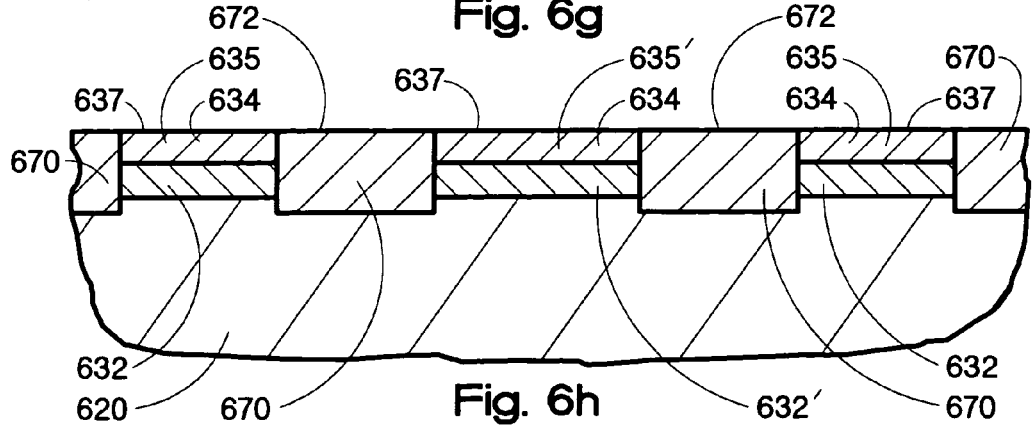

Planarizing layer creation process 586 (see FIG. 6g) is utilized to form or deposit planarizing dielectric layer 670 on the surface of the exposed regions of the substrate and over device structure surface 637. Any of a number of inorganic or polymeric dielectrics may be utilized. For example, silicon dioxide deposited using a plasma enhanced chemical vapor deposition process (PECVD) can be utilized. Other materials such as silicon nitride, silicon oxynitride, polyimides, benzocyclobutenes, as well as other inorganic nitrides and oxides also may be utilized. In addition, other silicon oxide films such as tetraethylorthosilicate (TEOS) and other "spin-on" glasses, as well as glasses formed by other techniques also may be utilized. Planarizing process 588 is used to planarize planarizing dielectric layer 670 (see FIG. 6h). For example, dielectric planarizing process 588 may utilize mechanical, resist etch back, or chemical mechanical processes, to form substantially planar surface 672 (see FIG. 6h).

Figure 6I:
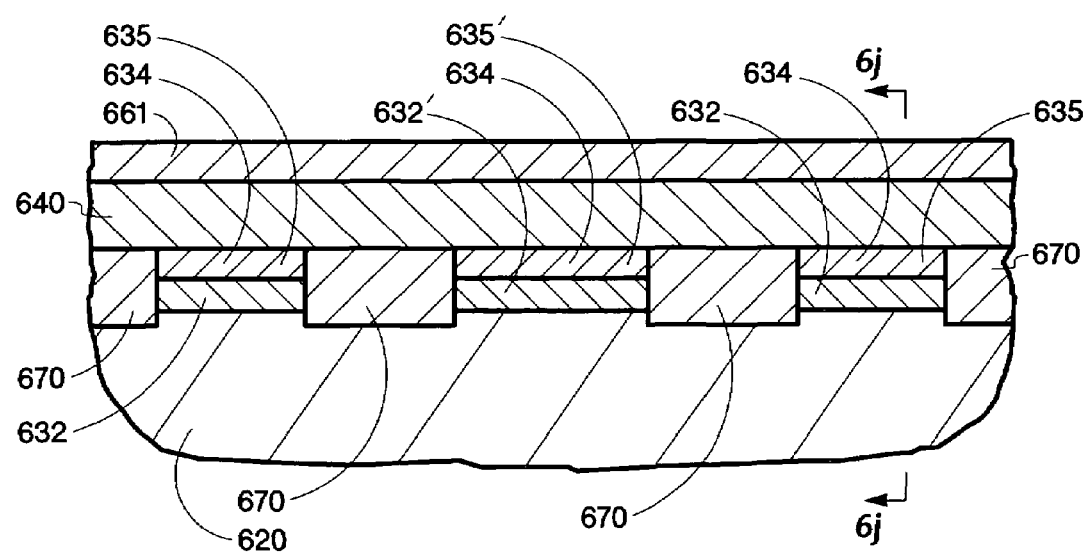

Switching layer creation process 590 is utilized to form or create switching layer 640 over device structure layer 634 and planarizing dielectric layer 670 on substantially planar surface 672 as shown in FIG. 6i. Depending on the particular application in which the cross-bar memory device will be utilized switching layer or storage media layer 640 may be formed from a wide variety of materials, such as organic or polymeric charge trapping layers, phase change layers such as indium selenide, ferroelectric layers such as piezoelectric ceramics or polymeric materials such as polyvinylidene fluoride, filament forming (i.e. antifuse) layers such as silver doped $As_2Se_3$, doped polymer layers such as polycarbonate doped with acceptor or donor molecules, conducting polymers such as polyethylenedioxythiophene polystyrene sulfonic acid, and molecular monolayers such as thiols and silane compounds are just a few examples of memory or switching layers that may be utilized. Depending on the particular material utilized various processes such as sputter deposition, CVD, spin coating, langmuir-blodgett deposition, and various self assembly processes may be utilized to form switching layer 640.

Second nano-imprinting process 592 is utilized both to form or to create second imprint layer 661 and to imprint the desired structures or features into second imprint layer 661 (see FIGS. 6i–6l). Second imprint layer 661 as shown in FIG. 6i may be applied utilizing any of the appropriate techniques such as spin coating, vapor deposition, spray coating or ink jet deposition described above for nano-imprinting layer process 582. Please note that FIGS. 6j–6n are rotated through ninety degrees compared to FIGS. 6a–6i, however, the structures described in these figures are not limited to this 90 degree angle. Typically, the imprint layer will be the same or similar to that described above for nano-imprinting layer process 582, however other imprint layer materials may also be utilized. For example, second imprint layer 661 (see FIG. 6i) may be a spin coated low viscosity, photopolymerizable, organosilicon solution. Second imprint layer 661 may be any moldable material.

Figure 6J:
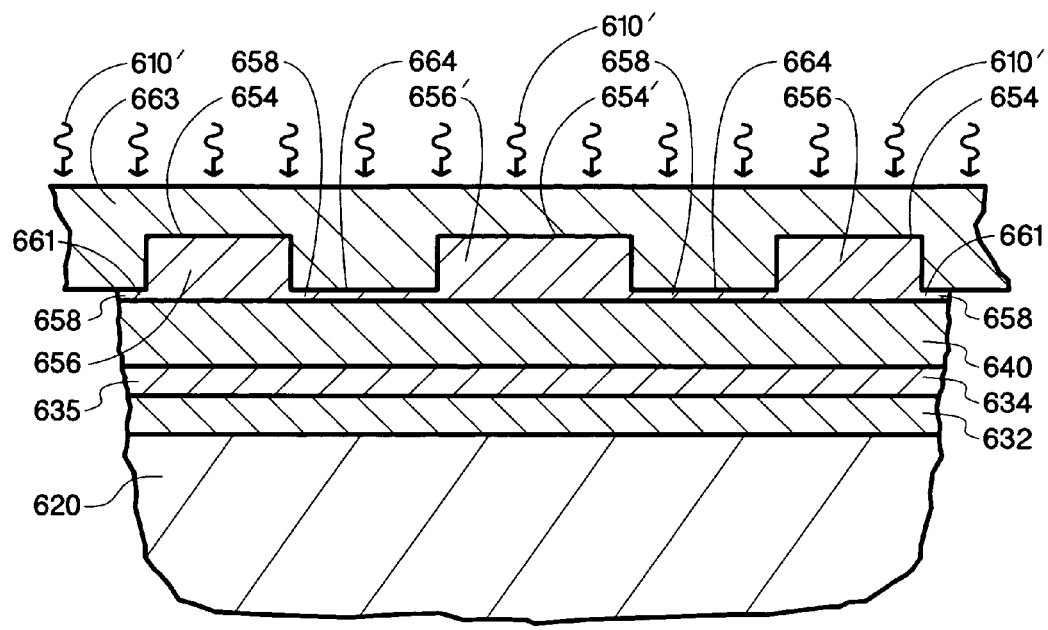

Second nano-imprinting process 592 also includes imprinting the desired structures or features into second imprint layer 661 (see FIG. 6*j*). Second nano-imprinter 663 is pressed or urged toward imprint layer 661 under a condition in which the imprint layer is pliable forming recessed feature 658 and raised features 656 and 656' in imprint layer 663. Both the nano-imprinting process as well as the nano-imprinter may be similar to that discussed above in nano-imprinting layer process 582. For illustrative purposes only the indented features 654 and 654', raised features 656 and 656', recessed features 658, and imprinter protrusions 664 are depicted in the same manner as that shown in FIG. 6*c*. It should be understood that different sizes and shapes may be utilized in the second nano-imprinting process. For example, an imprint layer formed utilizing a photo-curable material such as S-FIL Monomat Ac01 may be imprinted with a two-newton force utilizing an imprinter backpressure of 0.25 bar and a spread time of about 150 seconds. S-FIL Monomat Ac01 may be cured by an exposure (illustrated by photons 610' in FIG. 6*j*) of about 30 seconds with I-line radiation (i.e. 365 nanometers) utilizing a photo source such as a 1000 Watt Hg-Xe ultraviolet arc lamp.

Self-aligned nano-storage structures forming process 594 is utilized to form the second addressable lines and switching lines from their corresponding layers. Nano-storage structures forming process 594 includes removing recessed features 658 (see FIG. 6*j*) formed during nano-imprinting exposing the switching layer 640 (see FIG. 6*k*) in exposed regions 659. Removing the recessed features may be accomplished by any wet or dry etch process appropriate for the particular material utilized for the imprint layer as described above.

Figure 6K:
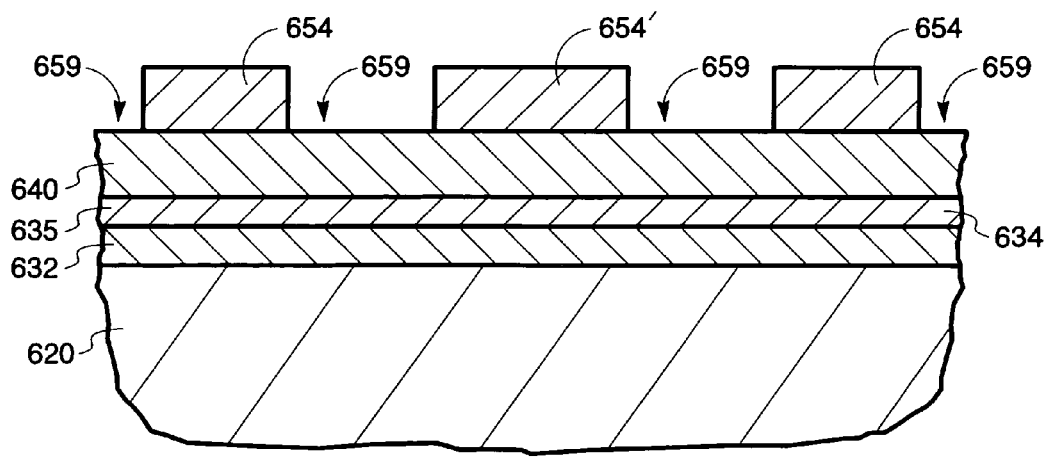
Figure 6L:
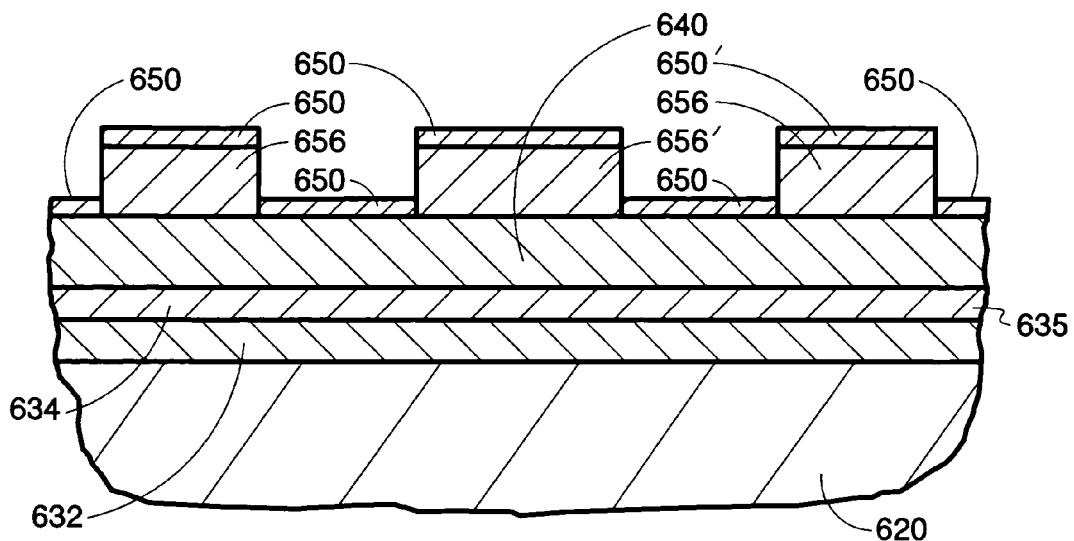
Figure 6M:
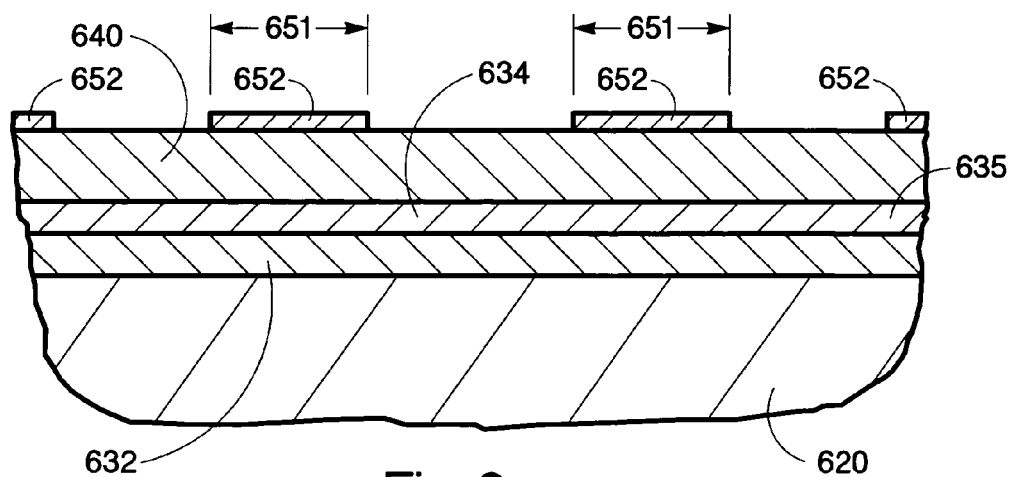
Figure 6N:
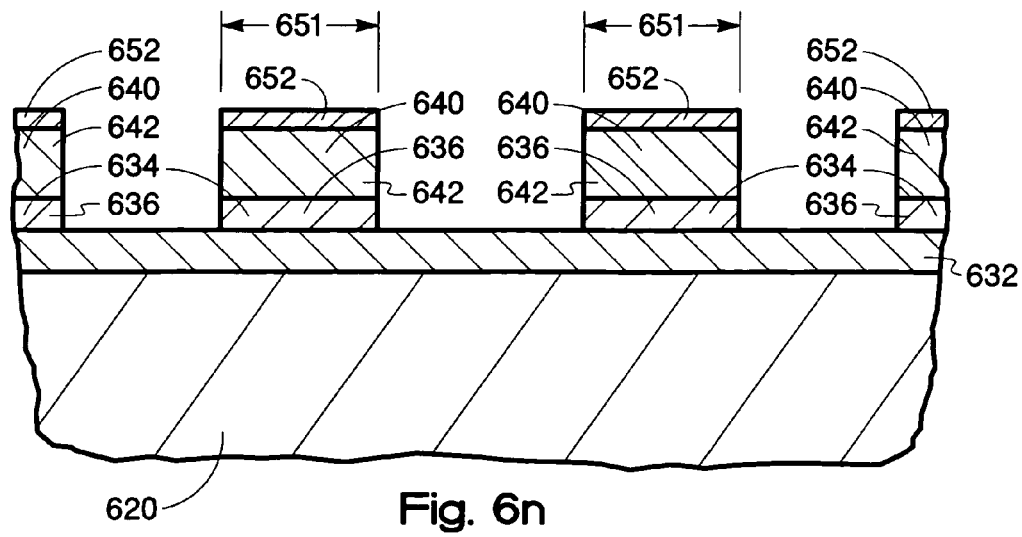

Self-aligned nano-storage structures forming process 594 also includes second addressable layer creation process to form or create second addressable layer 650 as shown in FIG. 6*l*. In this embodiment, second addressable layer 650 also serves as a hard etch mask. Second addressable layer 650 is formed by depositing a metal layer over the nano-imprinted surface after the recessed features have been removed. For example, a thin aluminum, tantalum, platinum, chromium, titanium, tungsten, gold, or copper layer may deposited over the nano-imprinted surface. Either a subsequent lift-off process or a selective chemical etch is utilized to remove raised portions 656 and 656' (see FIG. 6*l* and 6*m*) of the imprint layer, causing the addressable layer material deposited on top of raised portions 656 and 656' to be removed with the metal deposited in exposed regions 657 remaining forming second addressable lines 652 as shown in FIGS. 6*m* and 6*k*. In addition second addressable lines 652 also serve as a mask that provides for etching of the regions formerly covered by the raised features. The particular selective chemical etch or lift off process used will depend on the particular imprint material and hard etch mask material utilized. In an alternate embodiment, the second addressable layer creation process may be performed after switching layer creation process 590. In such embodiments second nano-imprint layer 661 is formed or created on second addressable layer 650.

Self-aligned nano-storage structures forming process 594 also includes etching of switching layer 640 and device structure lines 635 and 635' (as shown in FIG. 6*i*). The etching process etches those areas not protected by second addressable lines 652 as shown in FIGS. 6*m* and 6*n*. The etching of switching layer 640 and device structure lines 635 and 635' may utilize any wet or dry etch process or any combination of processes appropriate for the particular material or materials utilized. Any of the etching processes described above are just a few examples of the wide variety of etches that may be utilized. The etching process forms storage media lines having line width 651. Line width 651 typically has a width less than about 75 nanometers. In addition, the etching process also forms device structures 636 that are self aligned to storage media lines 641 and second addressable lines 652 in the direction of the lines while maintaining the self aligned structure to first addressable lines 632. The actual line width will depend on various parameters and components utilized in the memory device, such as the particular materials used to form second addressable layer 650 and switching layer 640 as well as the particular application in which the memory device will be used.

Figure 7A:
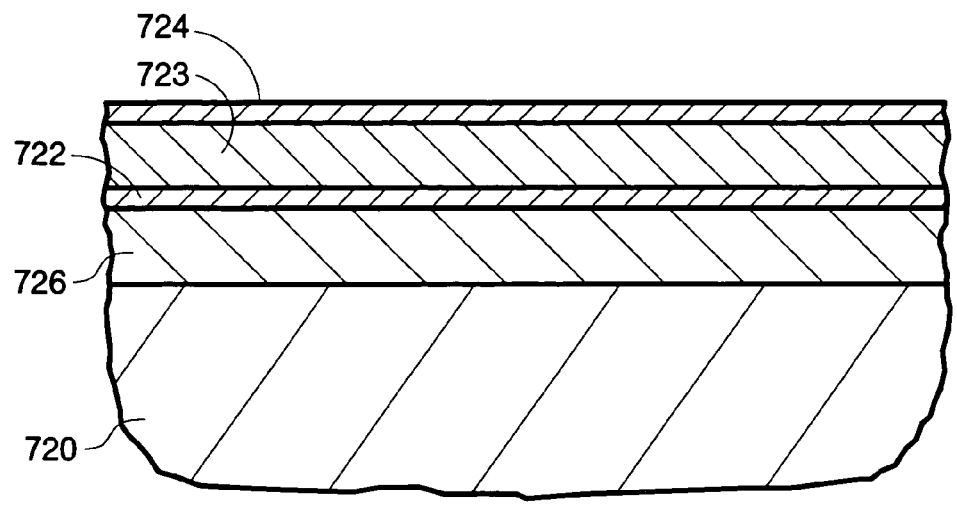
FIGS. 7a–7h are cross-sectional views of various processes used to create an exemplary embodiment of the present invention.
Figure 7B:
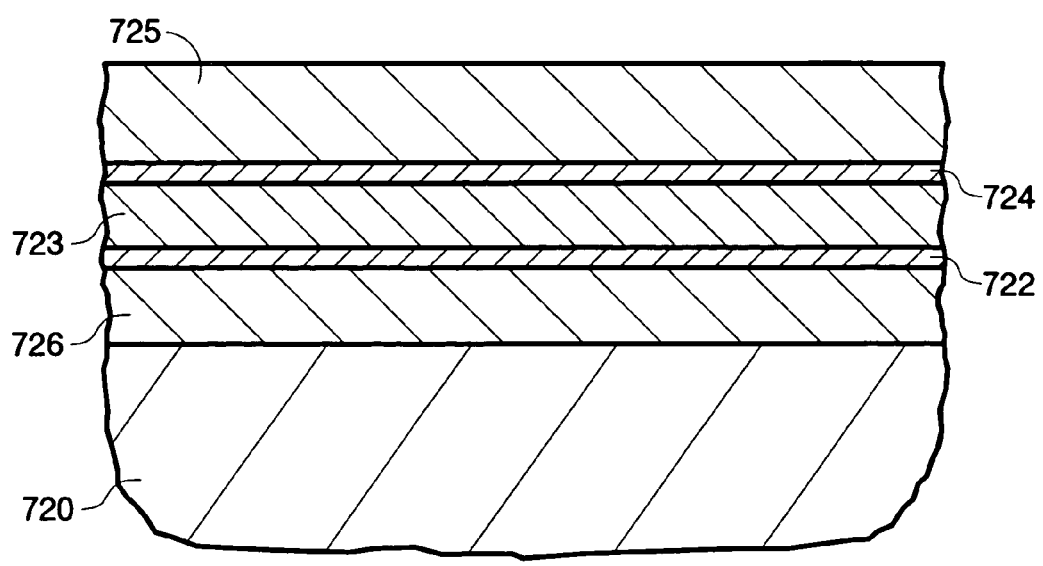

An exemplary process used to create an embodiment of the present invention is illustrated, in cross-sectional views, in FIGS. 7*a*–7*h*. In this embodiment, substrate 720 is an undoped silicon wafer with a buried oxide layer 726 formed on the silicon wafer. Buried oxide layer 726 electrically isolates devices built on the silicon wafer. Intrinsic silicon layer 722 is created or formed over buried oxide layer 726 followed by growth of p-doped epitaxial silicon layer 723 followed by growth of n-doped epitaxial silicon layer 724. Epitaxial silicon layers 723 and 724 form a semiconductor diode junction. In alternate embodiments, the p-doped and n-doped epitaxial layers may be reversed. In this embodiment, buried oxide layer 726, intrinsic silicon layer 722, p-doped epitaxial silicon layer 723, n-doped epitaxial silicon layer 724 have thicknesses of about 100 nanometers, 50 nanometers, 100 nanometers, and 50 nanometers respectively. Both the doping density and thickness may be varied to control the electrical properties of each layer. In addition, in still other embodiments various multiple epitaxial layers also may be grown. For example, an n+ or n++ doped layer may be grown on top of the n layer shown in FIG. 7*a* to enhance the contact properties to the switching or storage media layer (not shown). Another example includes a buried oxide/ p+ epitaxial layer/p epitaxial layer/n epitaxial layer/ n+ epitaxial layer as the thin film stack utilized to form rectifying structures. Further, various combinations of graded and abrupt dopant profiles may also be utilized. In this embodiment, any of the wide variety of epitaxial techniques such as chemical vapor deposition (CVD) including atmospheric (APCVD), low pressure (LPCVD), or plasma enhanced (PECVD) variants or molecular beam epitaxy (MBE) to name just a few may be utilized to form the epitaxial layers. Stopping or detection layer 725 is created on n-doped epitaxial silicon layer 724 as shown in FIG. 7*b*. Stopping layer 725, in this embodiment, is a silicon nitride layer blanket deposited utilizing conventional chemical vapor deposition equipment. Any material providing sufficient endpoint detection may form stopping layer 725.

Figure 7C:
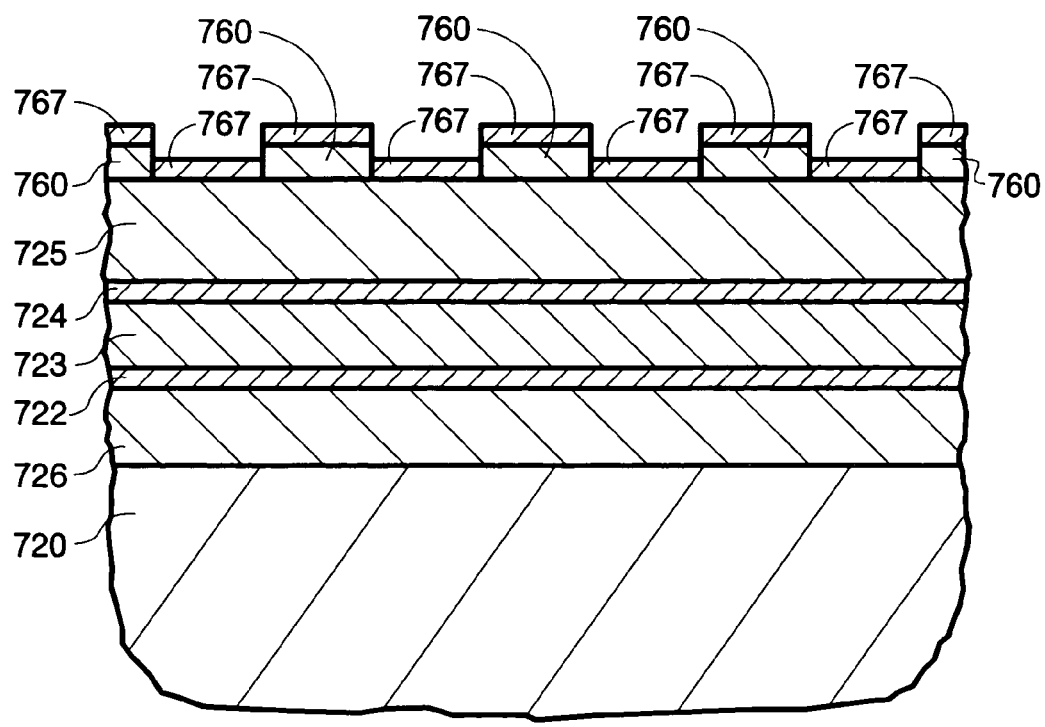
Figure 7D:
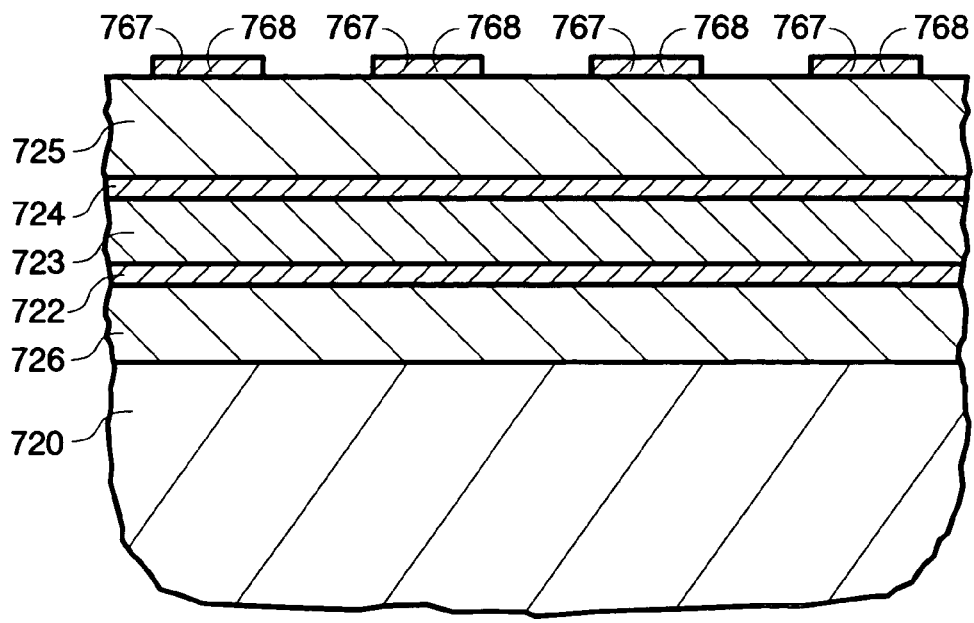

Imprint resist 760 is formed over stopping layer 725. In this embodiment, imprint resist 760 is PMMA and is formed utilizing spin coating. In alternate embodiments, any of the imprint materials or deposition techniques described above also may be utilized. After imprint resist 760 is formed a nano-imprinter is pressed or urged toward imprint resist 760 under a condition in which the imprint resist is pliable. Similar to the imprinting processes described in FIGS. 5 and 6 the nano-imprinter has features having a substantially complementary shape to that desired to be formed in imprint resist 760. In this embodiment, PMMA is used as an imprint resist and is subjected to a post-bake after spin coating to drive off excess solvent from the substrate surface. The imprint mold is then placed in contact with the imprint resist in the nano-imprinter and subjected to about 185° C. for about 20 minutes while applying about 1250 pounds per square inch (psi). In alternate embodiments, the imprint resist may be heated in the range from about 180° C. to about 195° C. for a time in the range from about 10 minutes to about 25 minutes at a pressure in the range from about 1000 (psi) to about 1500 psi. Any recessed portions (see FIG. 6*c*) formed during nano-imprinting are removed utilizing any wet or dry etch process appropriate for imprint resist 760 as described earlier. In this embodiment, a hard etch mask is utilized and is formed by depositing a thin thermally evaporated chromium layer 767 over the nano-imprinted surface after the recessed features have been removed as shown in FIG. 7c. In alternate embodiments, deposition processes such as electron beam evaporation, or chemical vapor deposition also may be utilized. A lift-off process is utilized to remove the remaining portions of the imprint resist including the chromium deposited on top of the imprint layer as shown in FIGS. 7c and 7d. The portions of chromium layer 767 that remain after the lift-off process form hard etch mask 768 as shown in FIG. 7d.

Figure 7E:
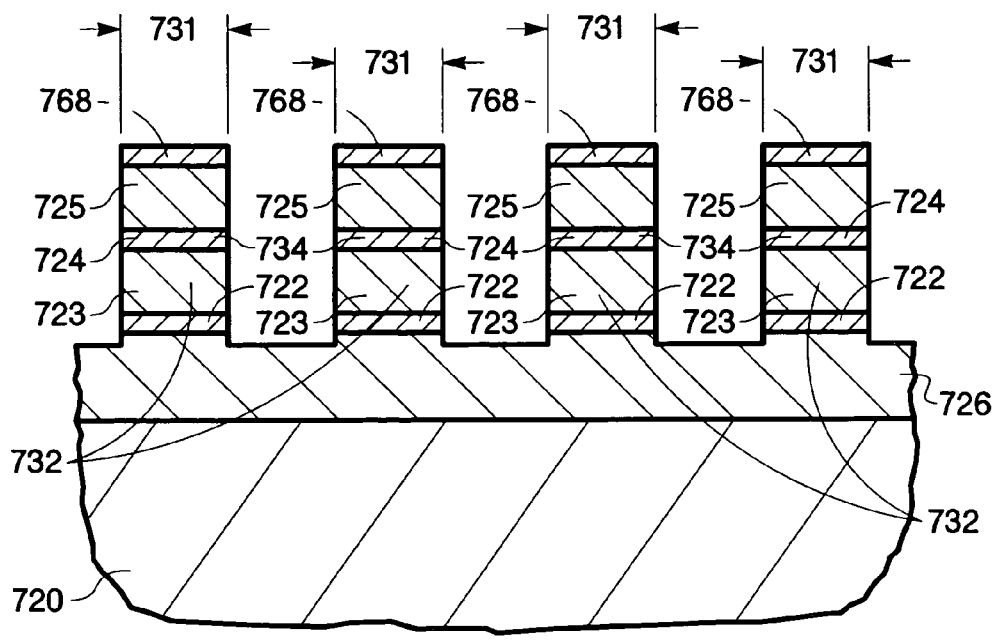
Figure 7F:
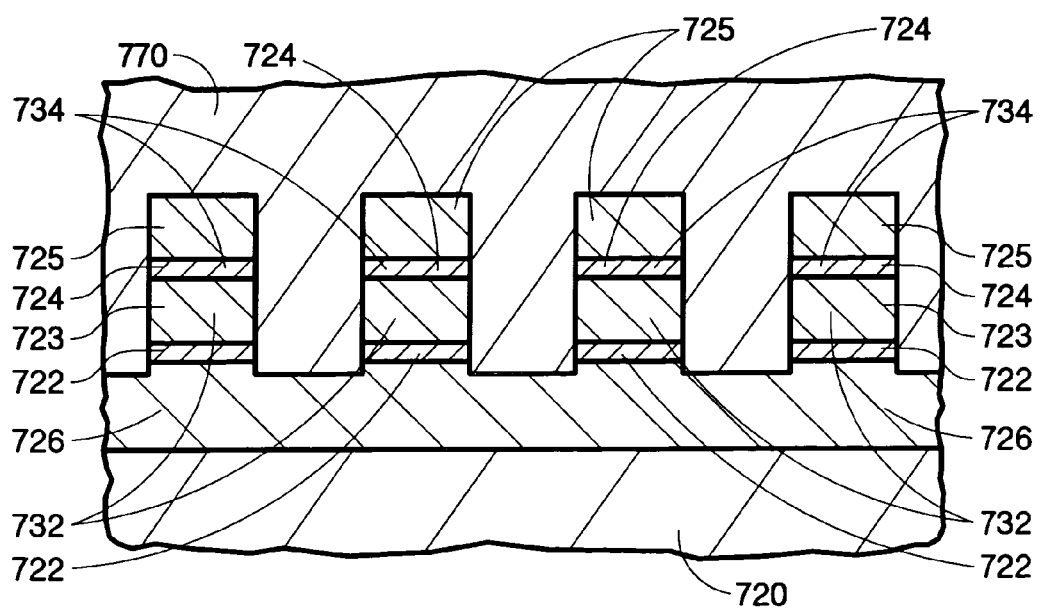

A silicon etch is utilized to etch through the silicon nitride stopping layer 725, as well as the n, p, and intrinsic epitaxial layers 724, 723, 722 respectively, in those regions not covered by chromium hard etch mask 768 as shown in FIG. 7e. In this embodiment, the etching process is stopped in buried oxide layer 726 providing electrical isolation for each rectifying line or structure formed in the etching process. The etching of these layers may utilize any wet, dry or combination of wet and dry etches appropriate for the particular materials utilized to form the epitaxial layers. In this embodiment, a two step dry etching process is utilized. The first etching process is performed at a pressure of about 10 milliTorr using a mixture of $C_4F_8/CF_4/Ar/SF_6$, at flow rates of 30/30/30/10 standard cubic centimeters (sscm) respectively. The second etching process is also performed at a pressure of about 10 milliTorr using an argon/helium mixture at flow rates of 10/10 sccm. The etching process forms first addressable lines 732 having line widths 731. Line width 731 typically is less than about 75 nanometers, and in this embodiment, line width 731 is about nanometers. In this embodiment n-doped epitaxial silicon layer 724 forms device structure layer 734 which after etching is self-aligned to first addressable lines 732 and also has a line width of about 30 nanometers as shown in FIG.7e. Chromium hard etch mask 768, in this embodiment, is removed utilizing a wet etch including ceric ammonium nitrate (Ce $(NH_4)_2(NO_3)_6$) and perchloric acid ($HClO_4$) with and etching time of about 40 minutes.

Figure 7G:
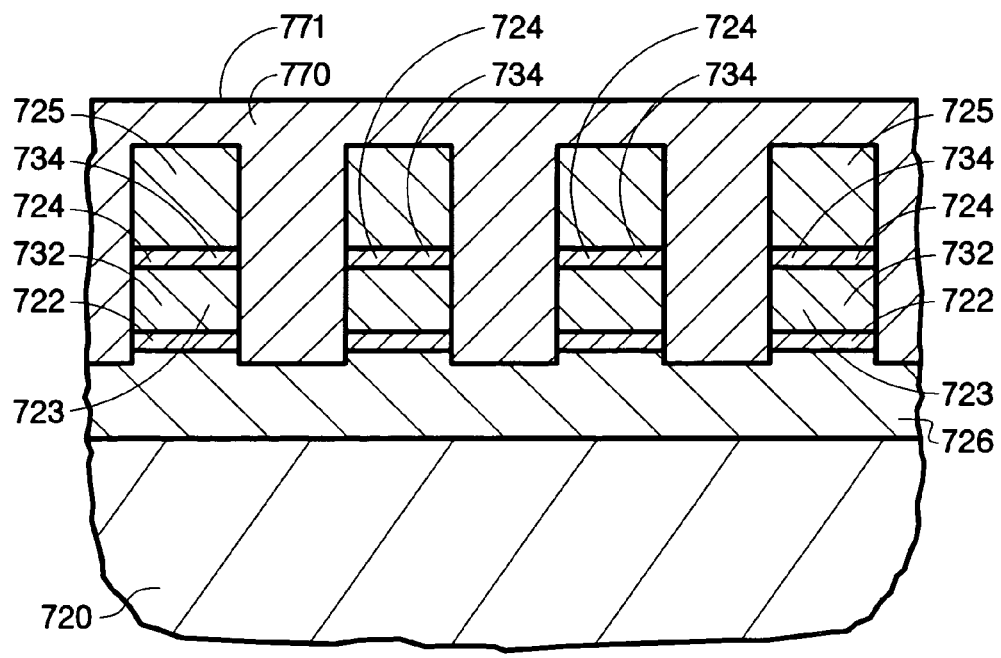
Figure 7H:
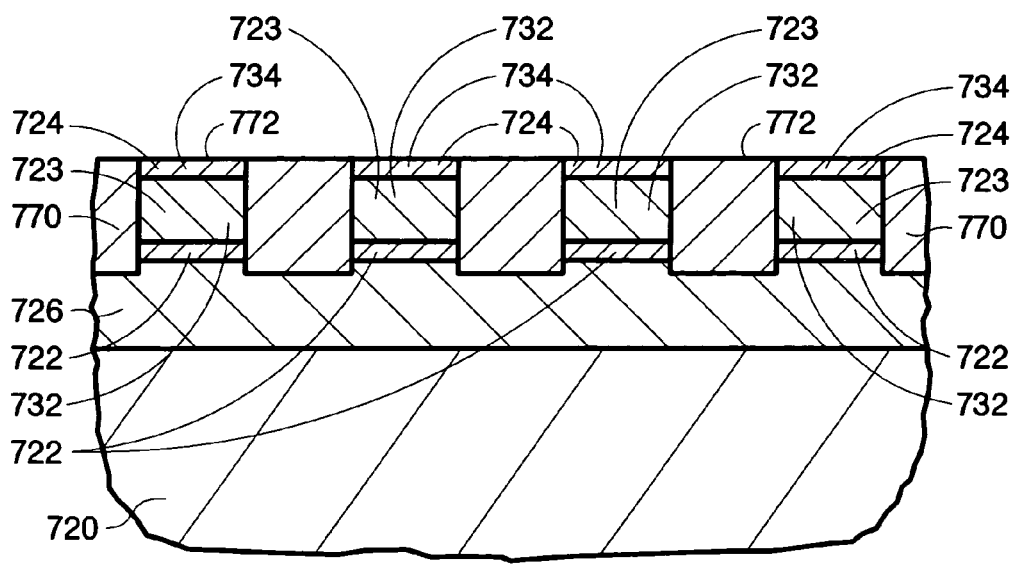

The planarizing process, in this embodiment, includes forming silicon dioxide planarizing layer 770 over silicon substrate 720 to a thickness greater than the combined thickness of the epitaxial silicon layers and the silicon nitride stopping layer filling in the regions formed between the lines formed in the etching process described above as illustrated in FIG. 7f. In this embodiment, low temperature (i.e. about 400° C.) PECVD using a tetraethyl orthosilicate precursor is utilized to form the silicon dioxide layer to a thickness of about 2 micrometers. After deposition of the planarizing layer is completed a chemical mechanical planarizing (CMP) process is utilized to form planar silicon dioxide surface 771 as shown in FIG. 7g. In this embodiment, a reactive ion etching process is utilized to further etch and remove the overlying silicon dioxide and silicon nitride to form planar surface 772 at the surface of device structure layer 734 as shown in FIG. 7h. The reactive ion etch process utilizes a mixture of argon and $CF_4$ at a pressure of about 1200 milliTorr using flow rates of 450 sccm and 50 sccm respectively for a silicon oxide etch rate of about 60 angstroms per second. In this embodiment, the storage media lines and second addressable lines are created utilizing processes similar to those described above in FIG. 6.

What is claimed is:

1. A memory device, comprising:
    a substrate;
    a plurality of self-aligned nano-rectifying elements, having:
        a plurality of first electrode lines disposed over said substrate,
        a plurality of device structures disposed on said plurality of first electrode lines forming said plurality of self-aligned nano-rectifying elements, each device structure having at least one lateral dimension less than about 75 nanometers;
    a plurality of switching elements, said switching elements disposed over and self-aligned in at least one direction with said device structures; and
    a plurality of second electrode lines disposed over, electrically coupled to, and self-aligned to said switching elements, whereby a memory device is formed.

2. The memory device in accordance with claim 1, wherein said plurality of first electrode lines further comprises a plurality of first semiconductor lines including a dopant of a first polarity.

3. The memory device in accordance with claim 2, wherein said plurality of first semiconductor lines further comprises a plurality of first epitaxial semiconductor lines.

4. The memory device in accordance with claim 2, wherein said plurality of device structures further comprises a plurality of semiconductor device structures including a dopant of a second polarity, wherein each semiconductor device structure forms a semiconductor junction with one of said plurality of first semiconductor lines, said semiconductor junction having an area with at least one lateral dimension less than about 75 nanometers.

5. The memory device in accordance with claim 2, wherein said plurality of semiconductor device structures further comprises a plurality of epitaxial semiconductor device structures.

6. The memory device in accordance with claim 2, wherein each device structure of said plurality of device structures further comprises:
    an intrinsic semiconductor structure disposed on one of said plurality of first semiconductor lines; and
    a second semiconductor device structure including a dopant of a second polarity, disposed on said intrinsic semiconductor structure, wherein said intrinsic semiconductor structure and said second semiconductor device structure each have at least one lateral dimension less than about 75 nanometers, whereby a plurality of p-i-n diode elements are formed.

7. The memory device in accordance with claim 2, wherein said plurality of first semiconductor lines is formed on an insulating layer formed on said substrate.

8. The memory device in accordance with claim 7, wherein said insulating layer is selected from the group consisting of SiOx, SixNy, SiOxNy, SixCy, and mixtures thereof.

9. The memory device in accordance with claim 1, wherein said plurality of first electrode lines further comprises a plurality of metal electrode lines, and wherein said plurality of device structures further comprises a plurality of semiconductor device structures including a dopant, forming a plurality of Schottky barrier contacts between said plurality of metal electrode lines and said plurality of semiconductor device structures, each Schottky barrier contact having an area with at least one lateral dimension less than about 75 nanometers.

10. The memory device in accordance with claim 1, wherein said plurality of first electrode lines further comprises a plurality of metal electrode lines, and wherein each device structure further comprises:
    a dielectric layer disposed on one of said plurality of metal electrode lines; and
    a metal layer disposed on said dielectric layer, forming a plurality of metal-insulator-metal rectifying elements, wherein each metal-insulator-metal rectifying element having at least one lateral dimension less than about 75 nanometers.

11. The memory device in accordance with claim 1, wherein each switching element of said plurality of switching elements further comprises a ferroelectric material.

12. The memory device in accordance with claim 1, wherein each switching element of said plurality of switching elements further comprises a phase change material.

13. The memory device in accordance with claim 1, wherein each switching element of said plurality of switching elements further comprises a filament forming material.

14. The memory device in accordance with claim 13, wherein said filament forming material is selected from the group consisting of $As_2Se_3$:Ag, $Cu_2S$, InSe, and mixtures thereof.

15. The memory device in accordance with claim 1, wherein each switching element of said plurality of switching elements further comprises an organic or polymer layer.

16. The memory device in accordance with claim 15, wherein said organic layer further comprises a self-assembled monolayer of organic molecules.

17. The memory device in accordance with claim 1, wherein each switching element of said plurality of switching elements further comprises a piezoelectric material.

18. The memory device in accordance with claim 1, wherein each switching element of said plurality of switching elements further comprises a chalcogenide material.

19. The memory device in accordance with claim 1, wherein said plurality of first electrode lines are substantially parallel to each other.

20. The memory device in accordance with claim 19, wherein said plurality of switching elements further comprises a plurality of switching lines substantially parallel to each other.

21. The memory device in accordance with claim 20, wherein said plurality of switching lines are substantially mutually orthogonal to said plurality of first electrode lines.

22. The memory device in accordance with claim 1, wherein each device structure has an area less than about 5,625 square nanometers.

23. A memory device, comprising:
a substrate;
a first plurality of conductive lines substantially parallel to each other disposed on said substrate;
a plurality of semiconducting junctions formed on said first plurality of conductive lines, said junctions having at least one lateral dimension less than about 75 nanometers;
a second plurality of conductive lines substantially parallel to each other and substantially mutually orthogonal to said plurality of semiconducting lines; and
a storage media disposed between said first and said second conductive lines and electrically coupled to said junctions and said second plurality of conductive lines.

24. A memory device comprising:
a substrate;
means for rectifying including a first plurality of conductive lines substantially parallel to each other disposed on said substrate, said means for rectifying self-aligned with said plurality of conductive lines, wherein said means for rectifying having at least one lateral dimension less than about 75 nanometers;
means for storing a data bit in each of a plurality of storage elements disposed over said first plurality of conductive lines and self-aligned to said means for rectifying; and
means for electrically addressing said plurality of storage elements, wherein each storage element self-aligned with said means for electrically addressing, and wherein each intersection of said means for electrically addressing and said first plurality of conductive lines defines a logic cell, of a memory structure.

25. A memory device, comprising:
a substrate;
a plurality of rectifying structures, disposed on said substrate, said rectifying structures form an i×j array, wherein i and j are integer values, each rectifying structure having at least one lateral dimension less than about 75 nanometers;
a plurality of storage media elements, each storage media element disposed on and electrically coupled to one of said rectifying structures, each storage media element having at least one lateral dimension less than about 75 nanometers; and
a plurality of electrical conductor lines disposed on and electrically coupled to said plurality of storage media elements, wherein each storage media element is self-aligned to one of said rectifying structures and is self-aligned to one of said electrical conductor lines.

26. A memory device, comprising:
a substrate;
a plurality of self-aligned nano-rectifying elements, having:
a plurality of first conductive lines disposed over said substrate, each first conductive line having at least one lateral dimension less than about 75 nanometers,
a plurality of device structures disposed on said plurality of first conductive lines, each device structure having at least one lateral dimension less than about 75 nanometers, wherein the combination of said first conductive lines and said device structures forms said plurality of nano-rectifying elements;
a plurality of switching elements, each switching element disposed on and electrically coupled to one of said plurality of device structures; and
a plurality of second conductive lines, said second conductive lines electrically coupled to said plurality of switching elements, each second conductive line intersects with at least one first conductive line, wherein each nano-rectifying element is substantially facially coextensive, coincident, and coplanar with one of said plurality of first conductive lines and one of said plurality of switching elements.

27. A memory device, comprising:
a substrate;
a plurality of semiconducting lines including a dopant of a first polarity said semiconducting lines substantially parallel to each other and disposed over said substrate;
a plurality of semiconducting structures including a dopant of a second polarity disposed on said plurality of semiconducting lines;
a plurality of junctions formed between said lines and said semiconducting structures said junctions having at least one lateral dimension less than about 75 nanometers;
a switching element disposed on and electrically coupled to said semiconducting structures; and
a plurality of electrical conductors substantially parallel to each other, coupled to said storage media and substantially mutually orthogonal to said plurality of semiconducting lines.

* * * * *